Oct. 31, 1961 T. W. COOPER 3,007,092

SEMICONDUCTOR DEVICES

Filed Dec. 23, 1957

Theodore W. Cooper,
*INVENTOR.*
*BY.*
Billy A. Robbins
*AGENT.*

3,007,092

SEMICONDUCTOR DEVICES

Theodore W. Cooper, Torrance, Calif., assignor to Hughes Aircraft Company, Culver City, Calif., a corporation of Delaware Filed Dec. 23, 1957, Ser. No. 704,616
13 Claims. (Cl. 317—240)

This invention relates to semiconductor devices and more particularly to a method for attaching electrodes to a semiconductor crystal body for use in such devices, as well as to semiconductor crystal bodies constructed in accordance with the method.

In the prior art it has been found that the oxide films which form upon the surface of semiconductor materials have created many problems in attaching electrodes thereto. In some instances in order to overcome the barrier formed by the oxide film chemical fluxing agents have been utilized. Although such fluxing agents operate quite satisfactorily in most instances, it has been found that in some cases the residue fluxing material tends to contaminate the interior of the final translating device, thus rendering it in some cases inoperable.

Another means for overcoming the barrier formed by the oxide film has been to mechanically abrade the surface of the semiconductor crystal body to which a connection was to be made. While such a method operates quite satisfactorily, it must be done by hand and is, thus, quite time consuming for utilization in a mass production technique.

In either of the above indicated prior art methods of providing connections to semiconductor bodies, it has been found that in some instances the bond which is formed between the semiconductor body and the electrode attached thereto is weak and may tend to become disconnected in subsequent stages of production. Furthermore, in many instances when an electrode is bonded directly to the semiconductor body, the bonding material may tend to diffuse rapidly into the semiconductor body and where a connection is being made to a converted region thereof will short the P–N junction which is formed therebeneath.

Accordingly, it is an object of the present invention to provide a method for forming connections to semiconductor crystal bodies which eliminates the necessity for mechanical abrasion of the area to which the connection is to be made.

Another object of the present invention is to provide a method for forming a connection to a semiconductor body which eliminates the necessity of utilizing chemical fluxing agents to overcome oxide barriers upon the surface of the body.

Still another object of the present invention is to provide a method for forming a physically strong bond between the semiconductor crystal body and a connection which is made thereto.

A still further object of the present invention is to provide a method for forming a connection to a semiconductor crystal body which does not contaminate the crystal body nor the interior of the crystal housing.

A still further object of the present invention is to provide a method of forming a connection to a semiconductor crystal body by alloying while at the same time preventing diffusion into the crystal body of the bonding material which is utilized in forming the connection.

Yet another object of the present invention is to provide a method for forming a connection to a semiconductor crystal body which lends itself readily to mass production techniques.

Another object of the present invention is to provide a semiconductor translating body having connections strongly attached to the body which connections will remain firmly attached during all subsequent stages of production.

Still another object of the present invention is to provide a semiconductor crystal body having electrodes bonded thereto by alloying.

The method of the present invention comprises depositing on at least a portion of one surface of a semiconductor crystal body a volume of metallic material which has a relatively low solubility in a bonding material which is to be utilized in forming a connection to the body. The metallic material is also of the type which is wet by the bonding material. The metallic material is then contacted with a metallic bonding material and the combination is heated to a temperature above the melting point of the bonding material but below the melting point of the metallic material after which it is then cooled to form a connection to the semiconductor crystal body. The present invention also includes a semiconductor crystal body which is produced by carrying out the above method.

The method and semiconductor crystal body of the present invention will be more fully understood by reference to the following description taken in conjunction with the accompanying drawing in which.

The method of this invention may be carried out to form a connection to a semiconductor crystal body of any desired configuration. The connection may be made directly to the semiconductor crystal body itself for utilization, for example, as a base connection to a transistor. It may also be applied to form a connection to a fused junction regrown region of a semiconductor crystal body to provide an electrode for the emitter or the collector of a transistor. As an example of the type of semiconductor crystal body to which a connection may be made for attaching electrodes to regrown regions thereof, reference is made to Patent No. 2,736,847, issued to S. H. Barnes on February 28, 1956 and Patent No. 2,742,383, issued to S. H. Barnes et al., April 17, 1956.

Figure 1:
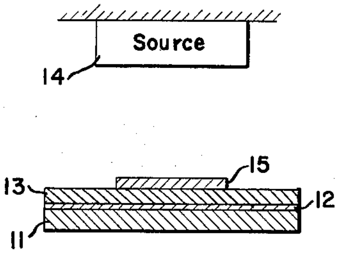
FIGS. 1, 2 and 3 are schematic diagrams partly in cross section illustrating various steps of the method of this invention as applied to semiconductor crystal bodies.

Another configuration of a semiconductor body to which connections may be made is that as shown in Patent No. 2,789,068, issued to J. Maserjian April 16, 1957. A device of the type described in the Maserjian patent is illustrated in FIG. 1 to which reference is hereby made and comprises a semiconductor body 11 having therein a regrown region 12 of a conductivity type opposite that of the body. A eutectic alloy region 13 is molecularly connected to regrown region 12 as described in the Maserjian patent. Such a semiconductor crystal body is manufactured by depositing molten aluminum upon a silicon wafer which is maintained at a temperature above the eutectic temperature of silicon and aluminum but below the melting point of silicon. The molten aluminum is deposited by evaporation in a vacuum and upon contacting the silicon body dissolves a portion thereof. The combination is then cooled, thus forming the regrown region and causing the silicon-aluminum eutectic to freeze out.

For purposes of description and by way of example only, the semiconductor crystal body of the type described in the Maserjian patent and illustrated in FIG. 1 will be utilized for illustrating the method of the present invention. It is to be expressly understood, however, that the method of the present invention may be carried out upon any semiconductor translating body of any desired configuration as hereinbefore pointed out.

The crystal body of FIG. 1 in carrying out the method of the present invention is positioned proximate a source 14 of metallic material. A volume 15 of metallic material is then deposited from source 14 upon at least a portion of the surface of the semiconductor crystal body.

The source of material may be of any desired type required by the particular application and semiconductor crystal body involved, for example a colloidal suspension of metallic material such as platinum, silver or gold may be utilized. To provide another example, a metallic material may be painted or sprayed upon the semiconductor body, for example silver, nickel or gold may be deposited in this manner. Still another example of a source of material is by depositing from a chemical solution as by electrolysis plating of nickel, silver or gold.

However, in the presently preferred embodiment of the method of this invention, the volume of metallic material 15 is deposited upon the semiconductor crystal body by evaporation in a vacuum. The vacuum evaporation may be carried out substantially the same as that described in the Maserjian patent, supra.

The material 15, which is deposited upon the semiconductor body is used to provide a subsequent connection to the semiconductor body but at the same time to isolate the semiconductor body from the bonding material which is utilized to form the connection. Any material may be utilized to provide the volume 15 so long as the following considerations are met: material 15 must have a low solubility in the bonding material which is to be employed in forming the connection to the body; material 15 must, however, at the same time be capable of being wet by the bonding material. Anothter factor which must be considered is that material 15 be capable of adhering to the surface upon which it is deposited. Many materials may be utilized which will meet the above considerations. Examples of some of the materials which will meet thees considerations are germanium, silver, nickel, platinum or gold.

In the presently preferred embodiment of the method of the present invention, silver has been found to work exceedingly well. Silver is capable of adhering to the semiconductor body even though there may be evidence of an oxide layer present thereon. As more fully hereinafter described, silver has a low solubility in the bonding material which is connected thereto, but at the same time is wet by the bonding material.

Figure 2:
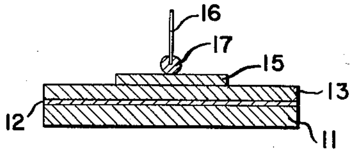
Figure 3:
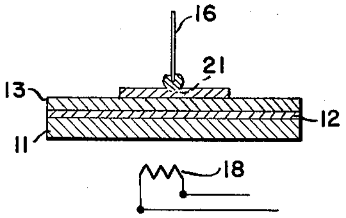

After the deposition of metallic layer 15 upon the semiconductor crystal body, it is contacted by a bonding material as illustrated in FIG. 2. The bonding material in the presently preferred embodiment of the method of the present invention has been formed upon the end of an electrode or lead 16 in the shape of a ball or pear as illustrated at 17. Utilizing the bonding material in such a configuration adapts it readily to mass production techniques. Referring now to FIG. 3, after bonding material 17 is caused to contact metallic layer 15, the combination is heated as by the resistive heating element 18 to a temperature above the melting point of bonding material 17 but below the melting point of metallic material 15. It is to be expressly understood, however, that heating element 18 is shown by way of example only and that any method known to the art may be utilized in heating the combination as above described. Upon melting, the bonding material 17 dissolves a portion of metallic material 15, but since material 15 has a relatively low solubility in bonding material 17, only a small portion thereof is dissolved and bonding material 17 is precluded from directly contacting the semiconductor crystal body.

The source of heat is then removed from the combination allowing it to cool. Upon cooling, a bond or alloy is formed between bonding material 17 and the layer of metallic material 15. Penetration of the bonding material into metallic layer 15 is, however, slight as illustrated in FIG. 3 by the dashed line 21. Although the penetration of the bonding material is only slight, an exceedingly strong mechanical bond is formed because of the alloying of the two materials. The particular bonding material which is utilized is not critical and any number of materials may be used so long as the following considerations are met: the bonding material must be capable of alloying with the metallic isolating material 15; the bond which is formed by the alloying must be sufficiently strong to withstand subsequent production steps as, for example, in packaging the crystal body in a housing and the bonding material must have a melting temperature below that of the melting temperature of the isolating layer.

In the presently preferred embodiment of the method of this invention, as illustrated in the accompanying drawing, and wherein silver is utilized as the isolating layer 15, it has been found that a eutectic alloy or mixture of gold and germanium works exceedingly well to form the required connection to the semiconductor body.

In some instances, it may be desirable to deposit an exceedingly thin isolating layer 15 upon the semiconductor crystal body to which the connection is to be made. When such a thin layer is desirable, it has been discovered that penetration of the isolating layer by the bonding material does occur in isolated cases. In order to prevent this, the electrode 16 may be made of the same material as isolating layer 15. For example, as in the presently preferred embodiment, where layer 15 is silver and bonding material 17 is gold-germanium alloy, a lead 16 of silver may be utilized. When such is done a portion of silver lead 16 is dissolved in the gold-germanium bonding material 17, thus tending to saturate the bonding material with silver and thereby more critically controlling the penetration of the bonding material into silver isolating material 15.

In some instances it has been discovered that the isolating material which is utilized may be such that the bonding material will fail to adequately bond to it. It has also been discovered that in some instances an exceedingly thin layer of isolating material is desirable and that it becomes difficult to make a desirable connection to the thin layer. In either of the above instances or where it may otherwise be desired, it has been found that a double layer of material may be deposited upon the surface of the semiconductor body to which the connection is to be made. This is illustrated as an alternative embodiment of the present invention in FIGS. 4–6.

Figure 4:
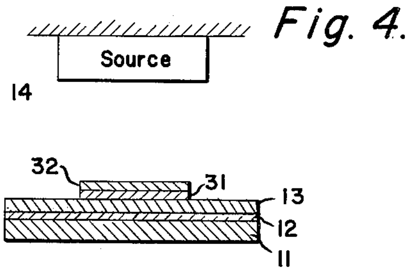
FIGS. 4, 5 and 6 are schematic diagrams partly in cross section illustrating steps in an alternate embodiment of the method of this invention as applied to semiconductor crystal bodies.

Referring now more particularly to FIG. 4, a semiconductor body 11, having a regrown or converted region 12 and a eutectic alloy region 13 similar to that shown in FIG. 1, has deposited upon the eutectic region 13 a layer of material 31. This layer of material is the isolating material as hereinabove described. Upon the isolating material there is deposited an additional layer of material 32. Material 32 is selected so that it will adhere to material 31 and will be readily wet by the bonding material which will be brought into contact with it. In the presently preferred embodiment isolating material 31 is silver and layer 32 is gold. Any particular combination of metals may be utilized so long as the isolating material meets the requirements hereinabove set forth.

Figure 5:
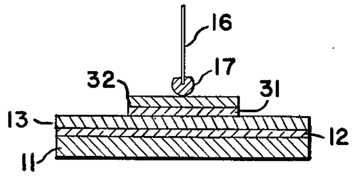
Figure 6:
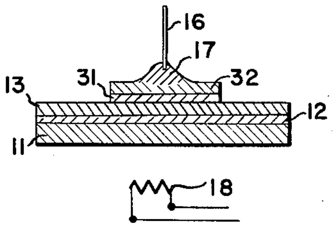

As illustrated in FIG. 5 the lead 16, having bonding material 17 attached to the end thereof, is brought into contact with the layer of material 32. Heat is then applied as hereinabove described and as illustrated in FIG. 6 causing the bonding material to melt. In the presently preferred embodiment when the bonding material melts it readily wets the gold layer 32 thus forming a connection thereto for lead 16. Since bonding material 17, which in the presently preferred embodiment consists of a gold-germanium alloy, readily wets gold layer 32, a relatively large-area contact may be easily formed. It should also be noted that although the gold-germanium alloy readily wets the gold layer there is no penetration through the isolating layer 31. Thus a good connection is made to the semiconductor body without the possibility of penetration of the bonding material to the semiconductor body.

As hereinabove described and if such is desirable, lead 16 may in the presently preferred embodiment of this invention consist of the same material as isolating layer 31 and in this manner further insure the lack of penetration through isolating layer 31.

Although the present invention has been discussed in conjunction with forming an electrical connection to a semiconductor diode of the type illustrated in the drawing, it should be understood that connections may be readily made utilizing the present invention to the emitter or collector regions of transistors or directly to the semiconductor body itself as hereinbefore pointed out.

There has been thus disclosed a method for attaching electrodes to semiconductor bodies which eliminates the necessity for utilizing mechanical abrasion or chemical fluxing agents while providing a physically strong alloyed bond which does not in any manner contaminate the semiconductor device resulting therefrom and, at the same time, lends itself readily to mass production techniques.

What is claimed is:

1. A semiconductor device comprising: a semiconductor body, a layer of metallic material on at least a portion of one surface of said body and having electrical connection with said body, an electrode of the same material as that of said layer, a metallic bonding material mechanically and electrically connecting said electrode to said metallic layer and being alloyed with said layer, said metallic layer being substantially insoluble in said metallic bonding material and being wet thereby, preventing penetration of said metallic layer by said metallic bonding material.

2. In a semiconductor device a semiconductor body comprising: a specimen of semiconductor material having at least one P–N junction therein, a layer of silver on at least a portion of one surface of said specimen, a silver electrode, and a metallic bonding material mechanically and electrically connecting said electrode to said layer, said bonding material being alloyed only with said silver layer and said electrode.

3. In a semiconductor device a semiconductor body comprising: a specimen of semiconductor material having at least one P–N junction therein, a layer of silver on at least a portion of one surface of said specimen, a layer of gold on said layer of silver, a silver electrode and a metallic bonding material disposed about at least one end of said electrode, said bonding material being alloyed with at least one of said layers to provide a mechanical and electrical connection between said specimen and said electrode.

4. In a semiconductor device a semiconductor body comprising: a specimen of semiconductor material having at least one P–N junction therein, a layer of silver on at least a portion of one surface of said specimen, a layer of gold attached to said layer of silver, an electrode, a metallic bonding material disposed about at least one end of said electrode and alloyed with said gold layer to provide a mechanical and electrical connection between said specimen and said electrode.

5. In a semiconductor device a semiconductor body comprising: a specimen of silicon semiconductor material of N conductivity type having a P conductivity type region therein and separated therefrom by a rectifying barrier, a volume of silicon-aluminum eutectic alloy ohmically attached to at least a portion of said region, a layer of silver on at least a portion of said eutectic alloy, an electrode, a metallic bonding material disposed about at least one end of said electrode and alloyed only with said layer of silver to provide a mechanical and electrical connection between said electrode and said silicon specimen.

6. In a semiconductor device a semiconductor body comprising: a specimen of silicon semiconductor material of N conductivity type having a P conductivity type region therein and separated therefrom by a rectifying barrier, a volume of silicon-aluminum eutectic alloy ohmically attached to at least a portion of said region, a layer of silver on at least a portion of said eutectic alloy, a layer of gold on said layer of silver, an electrode, and a metallic bonding material disposed about at least one end of said electrode and alloyed with said layer of gold to provide a mechanical and electrical connection between said electrode and said silicon specimen.

7. A semiconductor device according to claim 3 wherein said metallic bonding material is a gold germanium alloy.

8. A semiconductor device according to claim 4 wherein said metallic bonding material is a gold germanium alloy.

9. A semiconductor device according to claim 1 wherein said metallic material is a material of the class consisting of platinum, silver, gold, nickel and germanium.

10. A semiconductor device according to claim 5 wherein said electrode is a silver electrode.

11. A semiconductor device according to claim 6 wherein said electrode is a silver electrode.

12. A semiconductor device according to claim 5 wherein said bonding alloy is a gold germanium alloy.

13. A semiconductor device according to claim 6 wherein said bonding alloy is a gold germanium alloy.

References Cited in the file of this patent

UNITED STATES PATENTS

| | | |
|---|---|---|
| 2,707,319 | Conrad | May 3, 1955 |
| 2,793,420 | Johnston et al. | May 28, 1957 |
| 2,805,370 | Wilson | Sept. 3, 1957 |
| 2,811,682 | Pearson | Oct. 29, 1957 |
| 2,814,589 | Waltz | Nov. 26, 1957 |
| 2,820,932 | Looney | Jan. 21, 1958 |
| 2,824,269 | Ohl | Feb. 18, 1958 |
| 2,842,831 | Pfann | July 15, 1958 |